(12) United States Patent
Edem

(10) Patent No.: US 10,354,842 B2
(45) Date of Patent: Jul. 16, 2019

(54) PNEUMATIC EXHAUST SYSTEM

(71) Applicant: Lam Research Corporation, Fremont, CA (US)

(72) Inventor: Jacqulyn Edem, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 888 days.

(21) Appl. No.: 14/940,831

(22) Filed: Nov. 13, 2015

(65) Prior Publication Data
US 2017/0140901 A1 May 18, 2017

(51) Int. Cl.
| | |
|---|---|
| *H01L 21/687* | (2006.01) |
| *C23C 16/52* | (2006.01) |
| *F15B 11/06* | (2006.01) |
| *H01J 37/32* | (2006.01) |
| *C23C 16/455* | (2006.01) |
| *C23C 16/458* | (2006.01) |
| *C23C 16/505* | (2006.01) |
| *F15B 11/064* | (2006.01) |

(52) U.S. Cl.
CPC .... *H01J 37/32449* (2013.01); *C23C 16/4585* (2013.01); *C23C 16/45536* (2013.01); *C23C 16/45544* (2013.01); *C23C 16/505* (2013.01); *C23C 16/52* (2013.01); *F15B 11/06* (2013.01); *F15B 11/064* (2013.01); *H01J 37/32715* (2013.01); *H01J 37/32733* (2013.01); *H01J 37/32816* (2013.01); *H01J 37/32834* (2013.01); *H01J 37/32908* (2013.01); *H01L 21/68742* (2013.01)

(58) Field of Classification Search
CPC . F15B 11/064; F15B 11/06; F16F 9/00; F16F 9/02; H01J 3/32499; H01J 37/32834; H01J 37/32733; H01J 37/32816; H01J 37/32715; H01J 37/32908; C23C 16/4585; C23C 16/45544; C23C 16/505; C23C 16/45536; C23C 16/52; H01L 21/68707; H01L 21/68741
See application file for complete search history.

(56) References Cited

U.S. PATENT DOCUMENTS

| | | | | |
|---|---|---|---|---|
| 5,797,262 | A * | 8/1998 | Omoto | F15B 1/027 60/410 |
| 6,305,677 | B1 * | 10/2001 | Lenz | H01L 21/6831 269/13 |
| 2003/0037880 | A1 * | 2/2003 | Carducci | H01J 37/32522 156/345.43 |
| 2012/0097908 | A1 * | 4/2012 | Willwerth | H01L 21/68742 254/93 R |

* cited by examiner

Primary Examiner — Rakesh K Dhingra
Assistant Examiner — Laureen Chan
(74) Attorney, Agent, or Firm — Beyer Law Group LLP

(57) ABSTRACT

An apparatus, for use in a processing chamber is provided. A pneumatic cylinder is provided. A manifold with a supply and an exhaust is controllably connected to the pneumatic cylinder. A dry gas supply is in fluid connection with and provides positive pressure to the exhaust of the manifold.

16 Claims, 3 Drawing Sheets

PNEUMATIC EXHAUST SYSTEM

BACKGROUND

This disclosure relates to the manufacturing of semiconductor devices. More specifically, the disclosure relates to the manufacturing of semiconductor devices in a processing chamber with a pneumatic system.

In the manufacture of semiconductor devices, the semiconductor may be processed in a processing chamber. Some processing chambers have pneumatic systems that may be used in extreme environments.

SUMMARY

Disclosed herein are various embodiments, including an apparatus for use in a processing chamber. A pneumatic cylinder is provided. A manifold with a supply and an exhaust is controllably connected to the pneumatic cylinder. A dry gas supply is in fluid connection with and provides positive pressure to the exhaust of the manifold.

Other embodiments disclose an apparatus for processing a substrate. A plasma processing chamber is provided. The plasma processing chamber comprises a chamber wall forming a plasma processing chamber enclosure, a substrate support for supporting a substrate within the plasma processing chamber enclosure, a pressure regulator for regulating the pressure in the plasma processing chamber enclosure, at least one electrode for providing power to the plasma processing chamber enclosure for sustaining a plasma, a gas inlet for providing gas into the plasma processing chamber enclosure, and a gas outlet for exhausting gas from the plasma processing chamber enclosure. At least one RF power source is electrically connected to the at least one electrode. A gas source is in fluid connection with the gas inlet. A lifter is provided for moving the substrate. A pneumatic cylinder is connected to the lifter. A manifold with a supply and an exhaust is controllably connected to the pneumatic cylinder. A dry gas supply is in fluid connection with and provides positive pressure to the exhaust of the manifold. A controller is controllably connected to the gas source and the at least one RF power source, and the manifold.

These and other features will be described in more detail below in the detailed description and in conjunction with the following figures.

BRIEF DESCRIPTION OF THE DRAWINGS

The disclosed inventions are illustrated by way of example, and not by way of limitation, in the figures of the accompanying drawings and in which like reference numerals refer to similar elements and in which.

DETAILED DESCRIPTION

Embodiments will now be described in detail with reference to a few of the embodiments thereof as illustrated in the accompanying drawings. In the following description, specific details are set forth in order to provide a thorough understanding of the present disclosure. However, the present disclosure may be practiced without some or all of these specific details, and the disclosure encompasses modifications which may be made in accordance with the knowledge generally available within this field of technology. Well-known process steps and/or structures have not been described in detail in order to not unnecessarily obscure the present disclosure.

Figure 1:
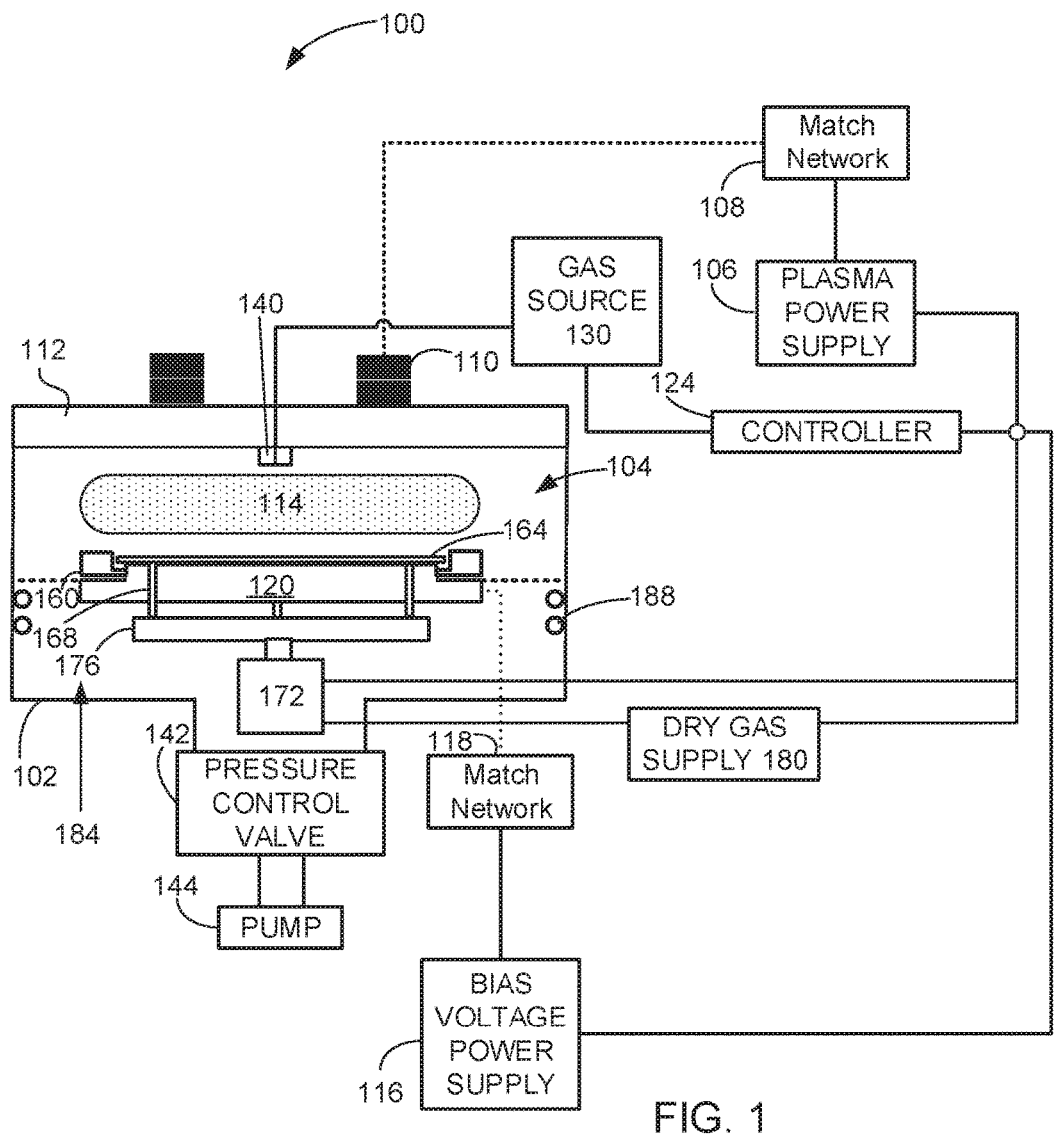
FIG. 1 schematically illustrates a cross-sectional view of an example of a plasma processing chamber, which may be used in an embodiment.

To facilitate understanding, FIG. 1 schematically illustrates a cross-sectional view of an example of a plasma processing chamber 100 which may be used in an embodiment. The plasma processing chamber 100 includes a plasma reactor 102 having a plasma processing confinement chamber 104 therein. A plasma power supply 106, tuned by a match network 108, supplies power to a TCP coil 110 located near a power window 112 to create a plasma 114 in the plasma processing confinement chamber 104 by providing an inductively coupled power. The TCP coil (upper power source) 110 may be configured to produce a uniform diffusion profile within the plasma processing confinement chamber 104. For example, the TCP coil 110 may be configured to generate a toroidal power distribution in the plasma 114. The power window 112 is provided to separate the TCP coil 110 from the plasma processing confinement chamber 104 while allowing energy to pass from the TCP coil 110 to the plasma processing confinement chamber 104. A wafer bias voltage power supply 116 tuned by a match network 118 provides power to an electrode 120 to set the bias voltage on the substrate 164 which is supported by the electrode 120.

As shown in FIG. 1, the plasma processing chamber 100 further includes a gas source/gas supply mechanism 130. The gas source 130 is in fluid connection with plasma processing confinement chamber 104 through a gas inlet, such as a gas injector 140. The gas injector 140 may be located in any advantageous location in the plasma processing confinement chamber 104, and may take any form for injecting gas. The process gases and byproducts are removed from the plasma process confinement chamber 104 via a pressure control valve 142 and a pump 144, which also serve to maintain a particular pressure within the plasma processing confinement chamber 104. The pressure control valve 142 can maintain a pressure of less than 1 Torr during processing. An edge ring 160 is placed around the wafer 164. A Kiyo by Lam Research Corp. of Fremont, Calif., may be used to practice an embodiment. In this embodiment, lifter pins 168 are provided to lift the substrate 164 during a removal process. A lifter actuator 176 may be used to move the lifter pins 168. A pneumatic control system 172 may be used to move the lifter actuator 176. A dry gas supply 180 is in fluid connection with the pneumatic control system 172. A controller 124 is controllably connected to the gas source 130, plasma power supply 106, the bias voltage power supply 116, and the pneumatic control system 172. A bowl 184 is formed in the bottom of the plasma reactor 102 and encloses several of the items in the chamber including the pneumatic control system 172 and cooling lines 188. The bowl may form part of the exhaust system connected to the pressure control valve 142.

Figure 2:
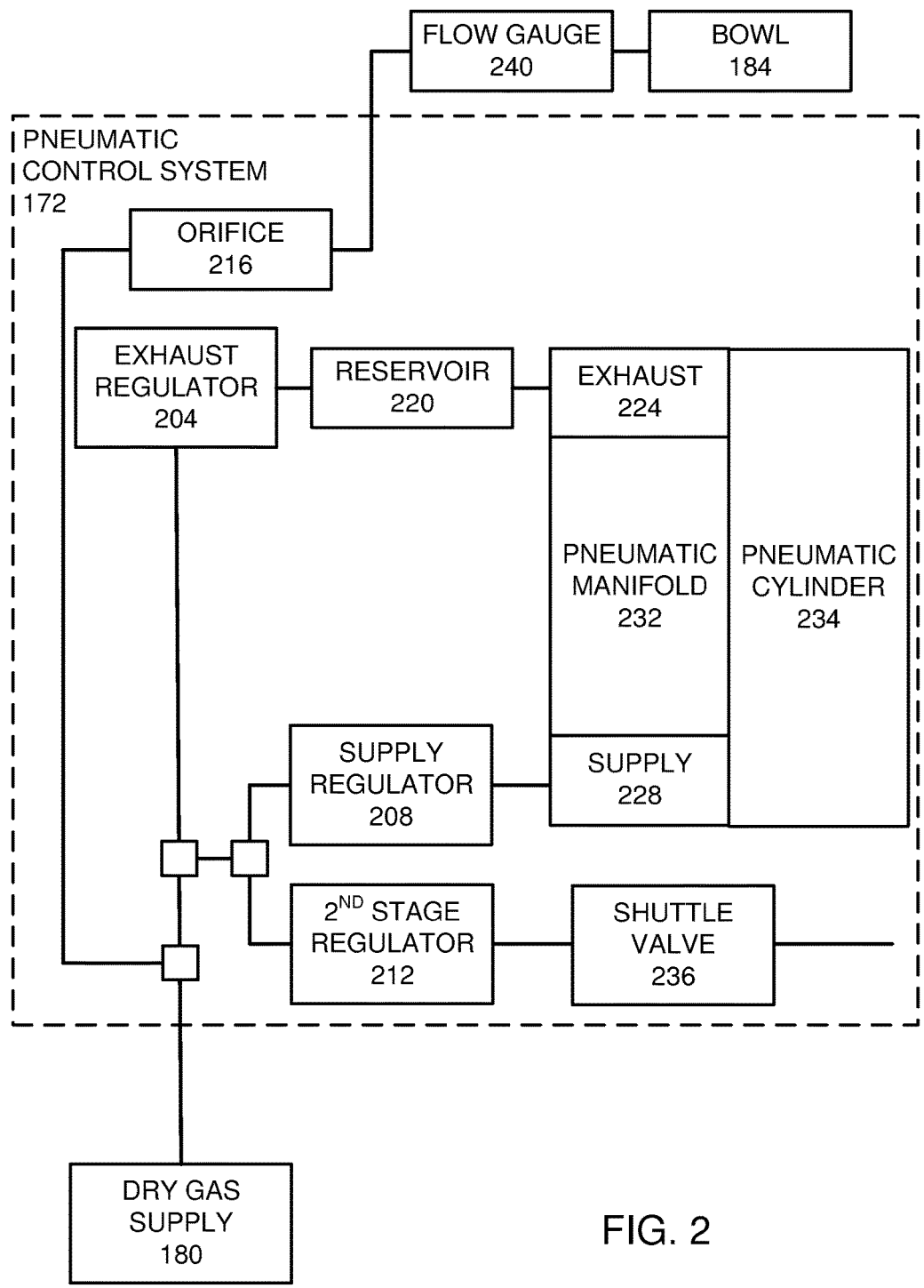
FIG. 2 is an enlarged schematic view of a pneumatic control system.

FIG. 2 is a schematic view of the pneumatic control system 172 with the dry gas supply 180. In this embodiment, the dry gas supply 180 is an $N_2$ supply. In other embodiments, the dry gas supply 180 may be a dry air supply. The dry gas supply 180 is in fluid connection with an exhaust regulator 204, a supply regulator 208, a second stage regulator 212, and an orifice 216. The exhaust regulator 204 is in fluid connection with a reservoir 220, which is in fluid connection with an exhaust 224 of a pneumatic manifold 232. The supply regulator 208 is in fluid connection with a supply 228 of the pneumatic manifold 232. The pneumatic manifold 232 is controllably connected to a pneumatic cylinder 234, which means that gas supplied or exhausted is used to control the movement of the pneumatic cylinder 234. The second state stage regulator 212 is in fluid connection with a shuttle valve 236. The orifice 216 is in fluid connection with a flow gauge 240, which is in fluid connection with the bowl 184. The controller 124 is controllably connected to the pneumatic manifold 232. The controllable connection between the controller 124 and the pneumatic manifold 232 allows the controller 124 to control the pneumatic manifold 232 to cause the pneumatic cylinder 234 to move, which in this example causes the pneumatic cylinder 234 to either expand or contract.

In an embodiment, the dry gas supply 180 provides a pressure of 60 to 90 psi. The orifice 216 is a 0.022 inch diameter orifice and is placed in a He enclosure. The exhaust regulator 204 is set to provide 6 psi. The supply regulator 208 is set to provide 75 psi. The second state regulator 212 is set to provide 60 psi. Such an arrangement has been found to provide a purge flow of $N_2$ of less than 12 lpm.

Figure 3:
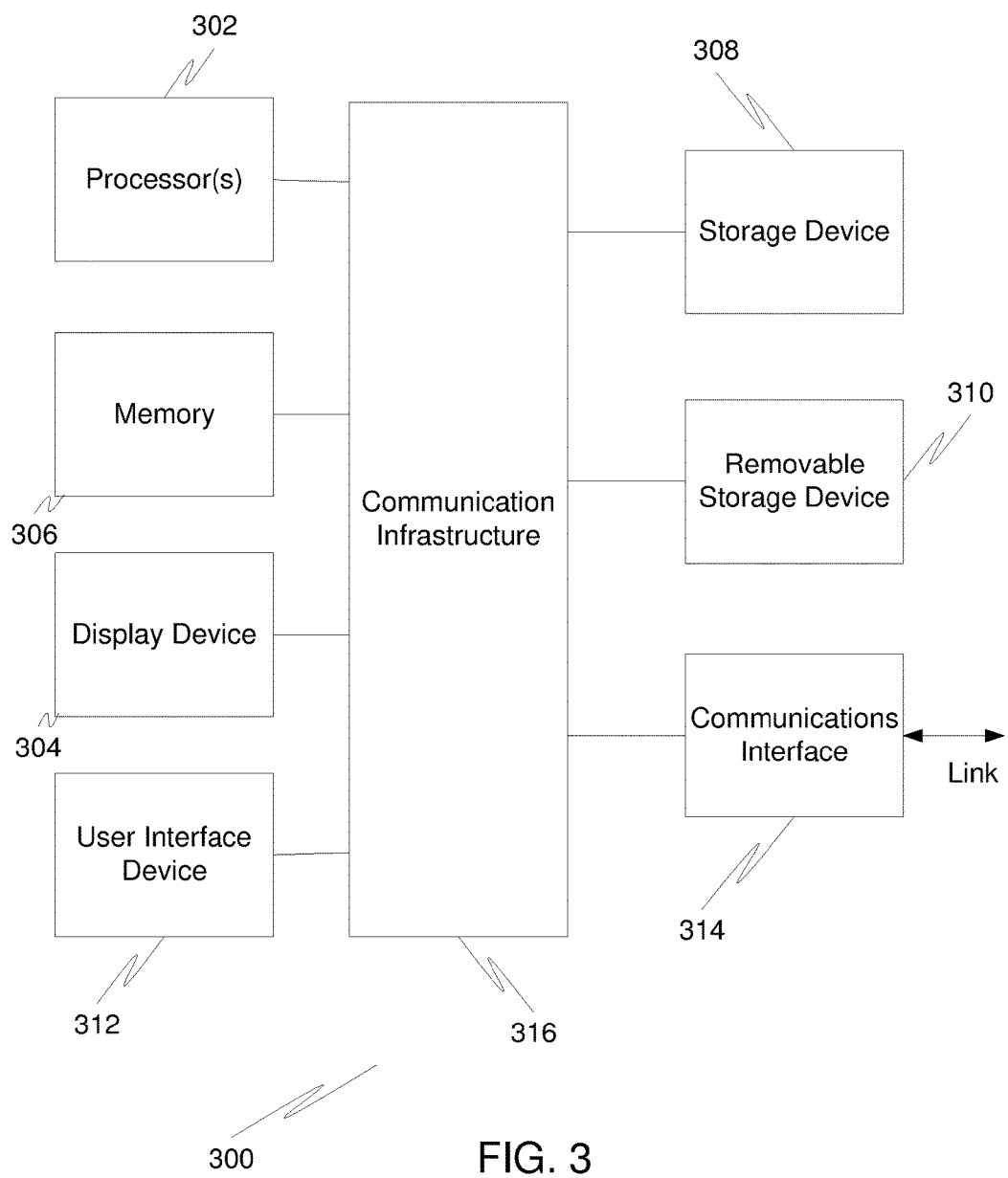
FIG. 3 is a high level block diagram showing a computer system, which is suitable for implementing a controller.

FIG. 3 is a high level block diagram showing a computer system 300, which is suitable for implementing a controller 124 used in embodiments. The computer system may have many physical forms ranging from an integrated circuit, a printed circuit board, and a small handheld device up to a huge super computer. The computer system 300 includes one or more processors 302, and further can include an electronic display device 304 (for displaying graphics, text, and other data), a main memory 306 (e.g., random access memory (RAM)), storage device 308 (e.g., hard disk drive), removable storage device 310 (e.g., optical disk drive), user interface devices 312 (e.g., keyboards, touch screens, keypads, mice or other pointing devices, etc.), and a communication interface 314 (e.g., wireless network interface). The communication interface 314 allows software and data to be transferred between the computer system 300 and external devices via a link. The system may also include a communications infrastructure 316 (e.g., a communications bus, cross-over bar, or network) to which the aforementioned devices/modules are connected.

Information transferred via communications interface 314 may be in the form of signals such as electronic, electromagnetic, optical, or other signals capable of being received by communications interface 314, via a communication link that carries signals and may be implemented using wire or cable, fiber optics, a phone line, a cellular phone link, a radio frequency link, and/or other communication channels. With such a communications interface, it is contemplated that the one or more processors 302 might receive information from a network, or might output information to the network in the course of performing the above-described method steps. Furthermore, method embodiments may execute solely upon the processors or may execute over a network such as the Internet in conjunction with remote processors that shares a portion of the processing.

The term "non-transient computer readable medium" is used generally to refer to media such as main memory, secondary memory, removable storage, and storage devices, such as hard disks, flash memory, disk drive memory, CD-ROM and other forms of persistent memory and shall not be construed to cover transitory subject matter, such as carrier waves or signals. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

In operation, nitrogen is provided by the dry gas supply 180. The dry gas supply 180 provides $N_2$ gas at 60 to 90 psi to the exhaust regulator 204, which provides an output pressure of 6 psi to the reservoir 220. The reservoir 220 in this example provides volume of at least three times the volume that the cylinder pulls in. The reservoir 220 provides the $N_2$ gas to the exhaust 224 of the pneumatic manifold 232. The dry gas supply 180 also provides $N_2$ gas to the supply regulator 208, the second stage regulator 212, and the orifice 216. The controller 124 may cause the supply regulator 208 to supply $N_2$ to the supply 228 of the pneumatic manifold at a pressure of 75 psi, which causes pneumatic cylinder 234 to cause the lift actuator 176 to push the lift pins 168 to raise the substrate 164. The controller 124 may cause the exhaust 224 of the pneumatic manifold to exhaust the pneumatic cylinder 234 to cause the actuator 176 to lower the lift pins 168 to lower the substrate 164. The dry gas supply 180 also provides $N_2$ gas to the second stage regulator 212, which provides the $N_2$ gas at 60 psi to the shuttle valve 236. The orifice 216 and flow gauge 240 allow less than 12 lpm to flow through the orifice 216 and to the bowl 184.

In the prior art, instead of supplying gas from the dry gas supply to the exhaust of the pneumatic manifold, a check valve, which exhausts to open atmosphere, is connected to the exhaust of the pneumatic manifold. Pneumatic systems operating in semiconductor processing systems at low temperatures have been found to unexpectedly fail. It is believed that water vapor in the atmosphere has entered the exhaust of the pneumatic manifold through the check valve. The water vapor condenses at the low temperatures causing failure of the pneumatic system.

This embodiment prevents water vapor from entering the exhaust of the pneumatic manifold. This embodiment does not require an additional gas source and is minimally invasive. This embodiment provides a positive backflow of a dry gas to the exhaust of the pneumatic manifold. In this embodiment the exhaust regulator 204 may be set once for continuous use.

In other embodiments, the pneumatic system may be used for other purposes, such as in the raising and lowering of confinement rings, the movement of a robotic arm, or the opening of a passage. In addition, the pneumatic system may be used in other types of plasma systems, such as a capacitively coupled confinement plasma system. The pneumatic system may be used in an etching system, deposition system, atomic layer deposition system, or atomic layer etching system.

While inventions have been described in terms of several preferred embodiments, there are alterations, permutations, and various substitute equivalents, which fall within the scope of this invention. There are many alternative ways of implementing the methods and apparatuses disclosed herein. It is therefore intended that the following appended claims be interpreted as including all such alterations, permutations, and various substitute equivalents as fall within the true spirit and scope of the present invention.

What is claimed is:

1. An apparatus, for use in a processing chamber, comprising:
   a pneumatic cylinder;
   a manifold with a supply and an exhaust controllably connected to the pneumatic cylinder; and a dry gas supply in fluid connection with and providing positive pressure to the exhaust of the manifold, wherein the fluid connection between the dry gas supply and the exhaust of the manifold, comprises:
an exhaust regulator in fluid connection with the dry gas supply; and
a reservoir directly connected between the exhaust regulator and the exhaust of the manifold, wherein the reservoir is not directly connected to the supply of the manifold.

2. The apparatus, as recited in claim 1, further comprising a supply regulator connected between the dry gas supply and the supply of the manifold wherein the supply regulator and the exhaust regulator are connected in parallel.

3. An apparatus for use in a processing chamber, comprising:
a pneumatic cylinder;
a manifold with a supply and an exhaust controllably connected to the pneumatic cylinder;
a dry gas supply in fluid connection with and providing positive pressure to the exhaust of the manifold, wherein the fluid connection between the dry gas supply and the exhaust of the manifold, comprises:
an exhaust regulator in fluid connection with the dry gas supply; and
a reservoir directly connected between the exhaust regulator and the exhaust of the manifold; and
wherein a bowl forming a part of the processing chamber is in fluid connection with the dry gas supply, wherein the bowl is connected in parallel with the exhaust regulator and the supply regulator.

4. The apparatus, as recited in claim 3, wherein the dry gas supply is a dry air supply or an $N_2$ supply.

5. The apparatus, as recited in claim 4, wherein the pneumatic cylinder is part of a pin lifter in a plasma processing chamber.

6. The apparatus, as recited in claim 1, wherein the reservoir has a volume and the pneumatic cylinder pulls in a volume of gas, wherein the volume of the reservoir is at least three times the volume of gas that the pneumatic cylinder pulls in as the pneumatic cylinder is being operated.

7. The apparatus, as recited in claim 1, wherein the dry gas supply is a dry air supply or an $N_2$ supply.

8. The apparatus, as recited in claim 1, wherein the pneumatic cylinder is part of a pin lifter in a plasma processing chamber.

9. An apparatus for processing a substrate, comprising:
a plasma processing confinement chamber comprising:
a substrate support for supporting a substrate within the plasma processing confinement chamber;
a pressure control valve for regulating the pressure in the plasma processing confinement chamber;
at least one electrode for providing power to the plasma processing confinement chamber for sustaining a plasma; and
a gas inlet for providing gas into the plasma processing chamber enclosure; at least one RF power source electrically connected to the at least one electrode;
a gas source in fluid connection with the gas inlet;
a lifter for moving the substrate;
a pneumatic cylinder connected to the lifter;
a manifold with a supply and an exhaust controllably connected to the pneumatic cylinder;
a dry gas supply in fluid connection with and providing positive pressure to the exhaust of the manifold, wherein the fluid connection between the dry gas supply and the exhaust of the manifold, comprises:
an exhaust regulator in fluid connection with the dry gas supply; and
a reservoir directly connected between the exhaust regulator and the exhaust of the manifold, wherein the reservoir is not directly connected to the supply of the manifold; and a controller controllably connected to the gas source, the at least one RF power source, and the manifold.

10. The apparatus, as recited in claim 9, further comprising a supply regulator connected between the dry gas supply and the supply of the manifold wherein the supply regulator and the exhaust regulator are connected in parallel.

11. The apparatus, as recited in claim 10, further comprising a bowl forming a part of the processing chamber wherein the bowl is in fluid connection with the dry gas supply, wherein the bowl is connected in parallel with the exhaust regulator and the supply regulator.

12. The apparatus, as recited in claim 11, wherein the dry gas supply is a dry air supply or an $N_2$ supply.

13. The apparatus, as recited in claim 12, wherein the pneumatic cylinder is part of a pin lifter in a plasma processing chamber.

14. The apparatus, as recited in claim 9, wherein the reservoir has a volume and the pneumatic cylinder pulls in a volume of gas, wherein the volume of the reservoir is at least three times the volume of gas that the pneumatic cylinder pulls in as the pneumatic cylinder is being operated.

15. The apparatus, as recited in claim 9, wherein the dry gas supply is a dry air supply or an $N_2$ supply.

16. The apparatus, as recited in claim 9, wherein the pneumatic cylinder is part of a pin lifter in a plasma processing chamber.

* * * * *